United States Patent [19]

Kiyozuka

[11] Patent Number: 5,343,479
[45] Date of Patent: Aug. 30, 1994

[54] SEMICONDUCTOR INTEGRATED CIRCUIT HAVING THEREIN CIRCUIT FOR DETECTING ABNORMALITY OF LOGICAL LEVELS OUTPUTTED FROM INPUT BUFFERS

[75] Inventor: Noboru Kiyozuka, Tokyo, Japan

[73] Assignee: NEC Corporation, Tokyo, Japan

[21] Appl. No.: 606,952

[22] Filed: Oct. 31, 1990

[30] Foreign Application Priority Data

Oct. 31, 1989 [JP] Japan ................. 1-283923

[51] Int. Cl.$^5$ ........................................ H04B 17/00
[52] U.S. Cl. .............................. 371/22.5; 371/22.1; 307/360; 307/351
[58] Field of Search .............. 371/22.5, 22.1; 307/360, 351; 324/158 R; 328/146

[56] References Cited

U.S. PATENT DOCUMENTS

| | | | |
|---|---|---|---|
| 3,851,189 | 11/1974 | Meyer | 307/360 |
| 4,321,489 | 3/1982 | Higuchi et al. | 307/360 |
| 4,943,945 | 7/1990 | Lai | 307/360 |
| 4,965,800 | 10/1990 | Farnbach | 371/22.1 |
| 5,132,929 | 7/1992 | Ochii | 365/201 |

OTHER PUBLICATIONS

Electronic Circuit Design, An Engineering Approach, Savant, Jr. et al., 1987, pp. 721–722.

*Primary Examiner*—Robert W. Beausoliel, Jr.
*Assistant Examiner*—Trinh Tu
*Attorney, Agent, or Firm*—Leydig, Voit & Mayer

[57] ABSTRACT

A semiconductor integrated circuit includes a plurality of input buffers, a plurality of high level signal abnormality detection circuits each connected to an output of a corresponding one of the input buffers, and a plurality of low level signal abnormality detection circuits each connected to an output of a corresponding one of the input buffers. A first concentrating circuit is connected to all the high level signal abnormality detection circuits so as to output a first abnormal signal when at least one of the high level signal abnormality detection circuits detects an abnormal high level signal, and a second concentrating circuit is connected to all the low level signal abnormality detection circuits so as to output a second abnormal signal when at least one of the low level signal abnormality detection circuits detects an abnormal low level signal.

17 Claims, 2 Drawing Sheets

SEMICONDUCTOR INTEGRATED CIRCUIT HAVING THEREIN CIRCUIT FOR DETECTING ABNORMALITY OF LOGICAL LEVELS OUTPUTTED FROM INPUT BUFFERS

BACKGROUND OF THE INVENTION

1. Field of the Invention

The present invention relates to a semiconductor integrated circuit, and more specifically a semiconductor integrated circuit capable of simply and easily detecting output abnormality of input buffers. In this specification, the term "input buffer" is used to include all buffers which receive an input signal for the semiconductor integrated circuit, and therefore, should be understood to include not only an input buffer used only for receiving an input signal, but also an input/output buffer or a bi-direction buffer having a function of receiving an input signal from an external device and a function of outputting an signal to an external device.

2. Description of Related Art

In the prior art, an input threshold voltage (Vth), which is one parameter of electrical characteristics of semiconductor integrated circuits, has been tested, for example after a step of manufacturing semiconductor integrated circuits. In one typical test method, a function test has been performed by applying to input terminals, a pattern of input voltages which are determined in accordance with types of the input terminals and which correspond to a maximum input low level voltage ($V_{IL-MAX}$) or a minimum input high level signal ($V_{IHMIN}$), both of which must be ensured for the semiconductor integrated circuit. If a normal operation can be found in the function test, it can be concluded that input buffers are normal.

However, the above mentioned conventional method has encountered a problem in which, since noise mixed into a voltage supply line for a measurement system directly adversely influences stability of the measurement system, integrated circuits which are not defective in characteristics have been often deemed to be defective as the result of the function test. Particularly, recent inclination of increase in the number of connection pins and elevation of performance (such as increase of an operation speed and increase of a driving power) has resulted in an increased transient current appearing at outputs of the integrated circuit. This is one cause for the above mentioned noise. In addition, the increase in the number of connection pins has resulted in an increased impedance of a voltage supply line of a test board (IC tester), which has further aggravated generation of the above mentioned noise, and therefore, the above mentioned problem has become more and more conspicuous.

SUMMARY OF THE INVENTION

Accordingly, it is an object of the present invention to provide a semiconductor integrated circuit which has overcome the above mentioned defect of the conventional one.

Another object of the present invention is to provide a semiconductor integrated circuit capable of detecting an input threshold voltage abnormality of input buffers for a short time, in a stable condition without being influenced by noise on a voltage supply line.

The above and other objects of the present invention are achieved in accordance with the present invention by a semiconductor integrated circuit including a plurality of input buffers, a plurality of high level signal abnormality detection circuits each connected to an output of a corresponding one of the input buffers, a plurality of low level signal abnormality detection circuits each connected to an output of a corresponding one of the input buffers, a first concentrating circuit, connected to all the high level signal abnormality detection circuits, for outputting a first abnormal signal when at least one of the high level signal abnormality detection circuits detects an abnormal high level signal, and a second concentrating circuit, connected to all the low level signal abnormality detection circuits, for outputting a second abnormal signal when at least one of the low level signal abnormality detection circuits detects an abnormal low level signal.

When a first pattern of input signals which make outputs of all the input buffers into a logical high level are applied to all the input buffers, if at least one of all the input buffers outputs an abnormal high level signal, a high level signal abnormality detection circuit connected to an output of the at least one input buffer outputting the abnormal high level signal, detects the abnormal high level signal, and therefore, the first concentrating circuit outputs the first abnormal signal.

When a second pattern of input signals which make the outputs of all the input buffers into a logical low level are applied to all the input buffers, if at least one of all the input buffers outputs an abnormal low level signal, the low level signal abnormality detection circuit connected to an output of the at least one input buffer outputting the abnormal low level signal, detects the abnormal low level signal, and therefore, the second concentrating circuit outputs the second abnormal signal.

In the above mentioned semiconductor integrated circuit, the output of each of the input buffers is connected to one high level signal abnormality detection circuit and one low level signal abnormality detection circuit The high level signal abnormality detection circuit detects abnormality in an input threshold of the associated input buffer when the associated input buffer outputs an abnormal high level signal, and the low level signal abnormality detection circuit detects abnormality in the input threshold of the associated input buffer when the associated input buffer outputs an abnormal low level signal. On the other hand, all the high level signal abnormality detection circuits are connected to the first concentrating circuit, so that the respective high level signal abnormality detections for all the input buffers are brought together, and all the low level signal abnormality detection circuits·are connected to the second concentrating circuit, so that the respective low level signal abnormality detections for all the input buffers are brought together. Thus, abnormality of the threshold characteristics of all the input buffers can be detected as a whole.

The above and other objects, features and advantages of the present invention will be apparent from the following description of preferred embodiments of the invention with reference to the accompanying drawings.

DESCRIPTION OF THE EMBODIMENTS

Figure 1:
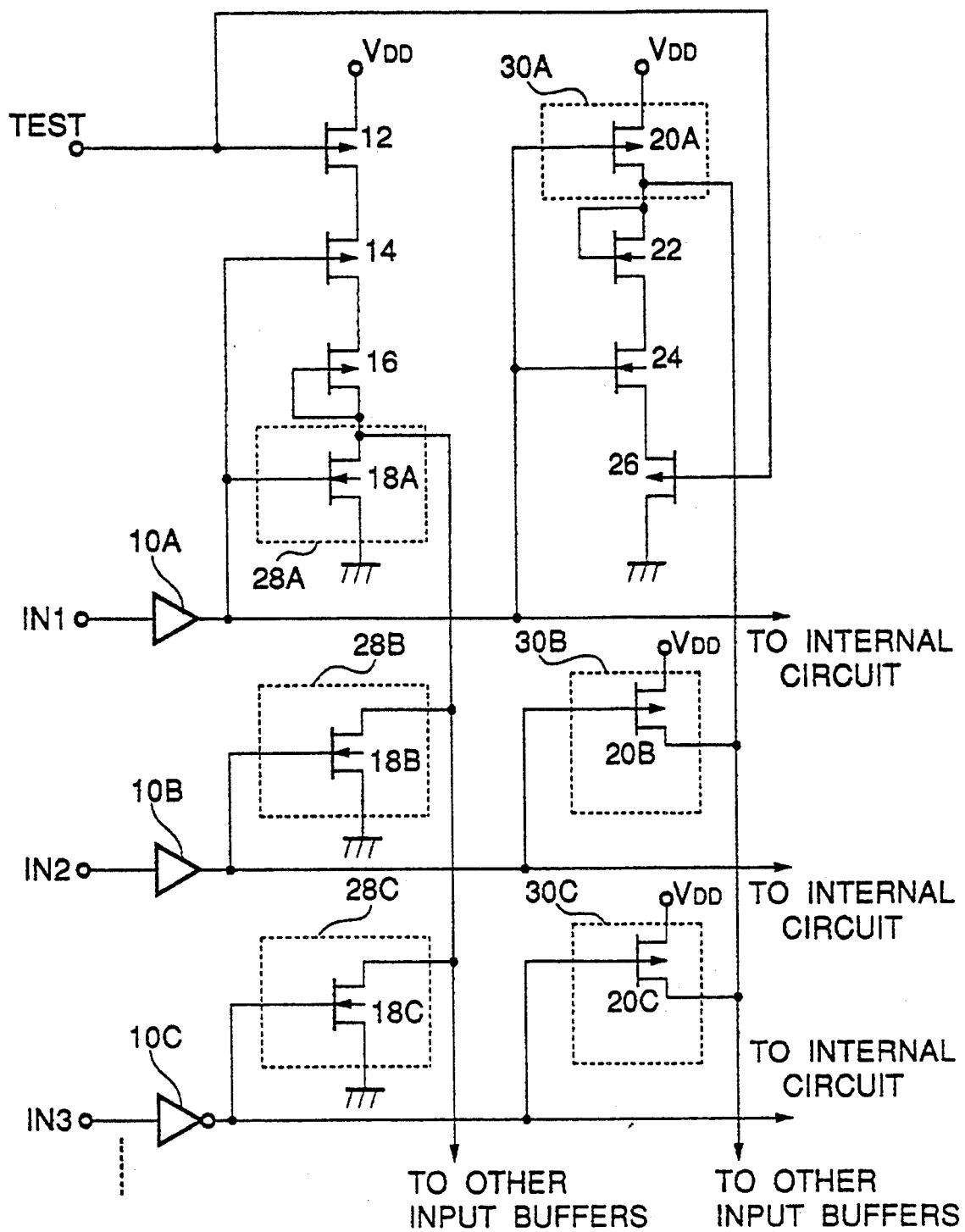
FIG. 1 is a circuit diagram of an input circuit portion of a first embodiment of the integrated circuit in accordance with the present invention.

Referring to FIG. 1, there is shown a circuit diagram of an input circuit portion of a first embodiment of the integrated circuit in accordance with the present invention.

In FIG. 1, one test terminal TEST and three input terminals IN1, IN2 and IN3 are shown. An actual integrated circuit includes a number of input terminals, a number of output terminals, and the other terminals. However, input terminals other than the three input terminals IN1 to IN3, the output terminals and the other terminals are omitted in the drawing for simplification of the drawing and since those terminals are not required in order to understand the present invention.

The input terminals IN1, IN2 and IN 3 are connected through non-inverting input buffers 10A and 10B and an inverting input buffer 10C, respectively, to internal circuits (not shown) of the integrated circuit.

The shown circuit includes a series circuit composed of three pMOS transistors 12, 14 and 16 and an nMOS transistor 18A which are connected in series in the named order between a positive voltage supply $V_{DD}$ and a ground. More specifically, a source of the pMOS transistor 12 is connected to the positive voltage supply $V_{DD}$, and a drain of the pMOS transistor 12 is connected to a source of the pMOS transistor 14. A drain of the pMOS transistor 14 is connected to a source of the pMOS transistor 16, and a drain of the pMOS transistor 16 is connected to a drain of the nMOS transistor 18A. A source of the nMOS transistor 18A is connected to the ground. The shown circuit also includes another series circuit composed of a pMOS transistor 20A, three nMOS transistors 22 and 24 and a pMOS transistor 26 which are connected in series in the named order between the positive voltage supply $V_{DD}$ and the ground. More specifically, a source of the pMOS transistor 20A is connected to the positive voltage supply $V_{DD}$, and a drain of the pMOS transistor 20A is connected to a drain of the nMOS transistor 22. A source of the nMOS transistor 22 is connected to a drain of the nMOS transistor 24, and a source of the nMOS transistor 24 is connected to a source of the pMOS transistor 26. A drain of the pMOS transistor 26 is connected to the ground.

The test terminal TEST is connected to a gate of each of the pMOS transistors 12 and 26. An output of the input buffer 10A is connected to a gate of each of the pMOS transistor 14, the nMOS transistor 18A, the pMOS transistor 20A and the nMOS transistor 24. In addition, each of the pMOS transistor 16 and the nMOS transistor 22 is connected in such a manner that the drain and a gate are short-circuited. Namely, each of he pMOS transistor 16 and the nMOS transistor 22 forms an active load.

Furthermore, each of nMOS transistors 18B and 18C is connected at its source to the ground and at its drain to the drain of nMOS transistor 18A so that the nMOS transistors 18A, 18B and 18C are connected in parallel between the pMOS transistor 16 and the ground. Gates of the nMOS transistors 18B and 18C are connected to outputs of the input buffers 10B and 10C, respectively. In addition, each of pMOS transistors 20B and 20C is connected at its source to the positive voltage supply VDD and at its drain to the drain of the pMOS transistor 20A, so that the pMOS transistor 20A, 20B and 20C are connected in parallel between the positive voltage supply $V_{DD}$ and the nMOS transistor 22. Gates of the pMOS transistors 20B and 20C are connected to the outputs of the input buffers 10B and 10C, respectively.

In the above mentioned circuit arrangement, the nMOS transistors 18A, 18B and 18C respectively constitute circuits 28A, 28B and 28C for detecting abnormality in a low level signal outputted from a corresponding input buffer. On the other hand, the pMOS transistors 20A, 20B and 20C respectively constitute circuits 30A, 30B and 30C for detecting abnormality in a high level signal outputted from a corresponding input buffer.

As shown in FIG. 1, since drains of the nMOS transistors 18A, 18B and 18C are connected directly to one another, it can be said that outputs of the low level signal abnormality detection circuit 28A, 28B and 28C constitute a wire logic circuit, more specifically a wired OR circuit. Similarly, since drains of the pMOS transistors 20A, 20B and 20C are connected directly to one another, it can be said that outputs of the high level signal abnormality detection circuit 30A, 30B and 30C constitute a wire logic circuit, more specifically a wired OR circuit.

Incidentally, in the following description, when any one of the nMOS transistors 18A, 18B and 18C is designated, the designated nMOS transistor will be representatively indicated with Reference Numeral 18. Similarly, when any one of the pMOS transistors 20A, 20B and 20C is designated, the designated nMOS transistor will be representatively indicated with Reference Numeral 20.

Now, assume that a low level signal is applied to the test terminal TEST so as to bring the circuit into a test mode. The pMOS transistors 12 and 26 are turned on. In this condition, a standard maximum input low level voltage $V_{ILMAX}$ and a standard minimum input high level signal $V_{IHMIN}$ are selectively applied to the input terminals in accordance with the type of the respective input buffers (for example, whether the input buffer connected to each input terminal is of the inverting type or the non-inverting type) so as to ensure that if all of the input buffers are normal, all of the input buffers output a logical high level signal or a logical low level signal.

In addition, it is also assumed that not-shown input terminals other than the input terminals IN1, IN2 and IN3 are ignored for simplification of the following description.

Assume that the maximum input low level voltage $V_{ILMAX}$ is applied to the input terminals IN1 and IN2 and the minimum input high level signal $V_{IHMIN}$ is applied to the input terminal IN3 so as to ensure that if all of the input buffers 10A to 10C are normal, all of the input buffers output a logical low level signal. In this case, if all signals applied to the low level signal abnormality detection circuit 28A, 28B and 28C (the gates of the nMOS transistors 18A, 18B and 18C) are at a normal low level, all of the nMOS transistors 18A, 18B and 18C and 24 are in an OFF condition, and therefore, no current will flow from the positive voltage supply $V_{DD}$ to the ground.

However, if there is a defective input buffer which does not output the normal logical low level, namely outputs a signal deemed to be a logical high level, in response to the input voltage $V_{ILMAX}$ or $V_{IHMIN}$, the nMOS transistor 18 included in the low level signal abnormality detection circuit connected to the defective input buffer is turned on. As a result, a current flows from the positive voltage supply through the transistor 12, the transistor 14, the transistor 16 and the turned-on transistor 18 to the ground. Accordingly, by monitoring a voltage supply current, it is possible to detect abnormality of the threshold voltage Vth in a group of input buffers.

Next assume that the maximum input low level voltage $V_{ILMAX}$ is applied to the input terminal IN3 and the minimum input high level signal $V_{IHMIN}$ is applied to the input terminals IN1 and IN2 so as to ensure that if all of the input buffers are normal, all of the input buffers output a logical high level signal. In this case, if all signals applied to the high level signal abnormality detection circuit 30A, 30B and 30C (the gates of the pMOS transistors 20A, 20B and 20C) are at a normal high level, all of the pMOS transistors 20A, 20B and 20C and 14 are in an OFF condition, and therefore, no current will flow from the positive voltage supply $V_{DD}$ to the ground.

However, if there is a defective input buffer which does not output the normal logical high level, namely outputs a signal deemed to be a logical low level, in response to the input voltage $V_{ILMAX}$ or $V_{IHMIN}$, the pMOS transistor 20 included in the low level signal abnormality detection circuit connected to the defective input buffer is turned on. As a result, a current flows from the positive voltage supply through the turned-on transistor 20, the transistor 22, the transistor 24 and the transistor 26 to the ground. Accordingly, by monitoring a voltage supply current, it is possible to detect abnormality of the threshold voltage Vth in a group of input buffers.

Considering on the basis of a relation between an input and an output, it can be said that the input buffer includes an inverter type, an non-inverting circuit type, a Schmitt circuit type, and others. However, by appropriately setting an input voltage level applied to the respective input terminals, the circuit shown in FIG. 1 can efficiently detect input threshold voltage abnormality of all the input buffers as a whole.

Figure 2:
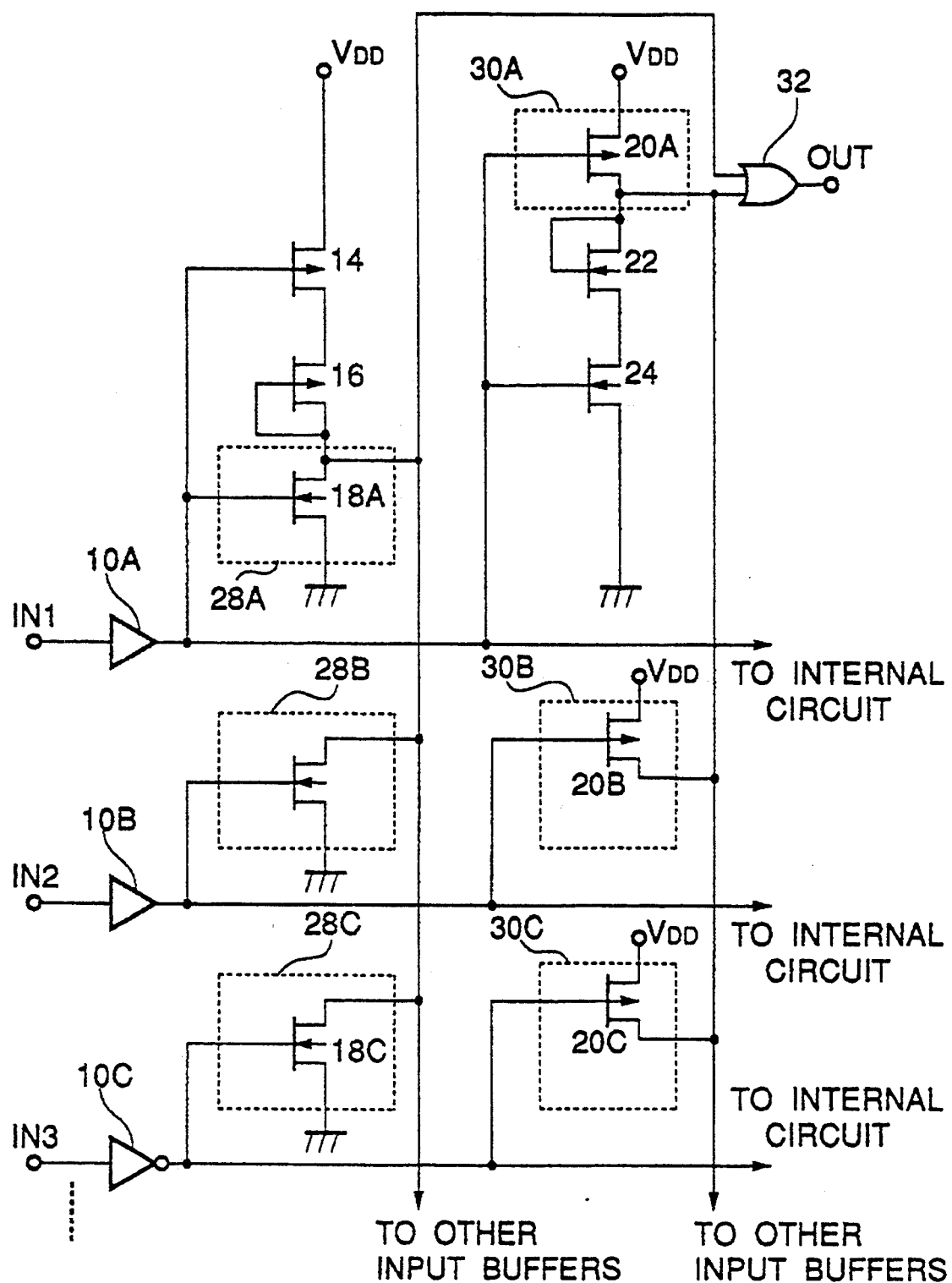
FIG. 2 is a circuit diagram of an input circuit portion of a second embodiment of the integrated circuit in accordance with the present invention.

Referring to FIG. 2, there is shown a circuit diagram of an input circuit portion of a second embodiment of the integrated circuit in accordance with the present invention. In FIG. 2, circuit elements corresponding to those shown in FIG. 1 are given the same Reference Numerals, and explanation thereof will be omitted.

The circuit shown in FIG. 1 is constructed to cause input buffer abnormality to be detected by an external device as abnormality in a voltage supply current. However, the circuit shown in FIG. 2 has an OR gate 32 having a first input connected to the wire logic coupling the abnormality detection circuits 28A, 28B and 28C and a second input connected to the wire logic coupling the abnormality detection circuits 30A, 30B and 30C, so that when any one of the abnormality detection circuits 28A, 28B, 28C, 30A, 30B and 30C detects input buffer abnormality, an abnormality signal is outputted from the OR gate 32 to an external output terminal OUT. On the other hand, the test terminal TEST and the pMOS transistors 12 and 26 turned on and off in response to the test signal supplied through the test terminal TEST are omitted in the circuit shown in FIG. 2.

Operation of the circuit shown in FIG. 2 excluding the above explained operation of the OR gate 32 is the same as that of circuit shown in FIG. 1, and therefore, explanation thereof will be omitted for simplification of description.

In the above mentioned two embodiments, at least either the test terminal TEST or the abnormality detection signal output terminal OUT is required as an exclusive terminal for test. However, the exclusive terminal for test is not necessarily required to be extracted as an external terminal of a packaged integrated circuit, since it is sufficient if the exclusive terminal for test can be used only at the time of wafer probing test.

In the above mentioned embodiments, since the input threshold voltage Vth is checked by an exclusive circuit, it is possible to perform the measurement, avoiding influence of noise on a voltage supply line caused by charging and discharging currents in outputs of the integrated circuit. Therefore, the measurement can be performed in a stable condition and with a high degree of measurement precision. The increase of measurement would make it possible to elevate quality of integrated circuits. In addition, it makes it possible for integrated circuit makers to reduce non-efficient portions in the process of mass production such as mis-discrimination of good products as being defective. Therefore, the present invention has a large advantage greatly convenient to the integrated circuit makers.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit comprising:
   a plurality of input buffers;
   a plurality of high level signal abnormality detection circuits, each connected to an output of a corresponding one of said input buffers;
   a plurality of low level signal abnormality detection circuits, each connected to an output of a corresponding one of said input buffers;
   a first concentrating circuit, connected to all said high level signal abnormality detection circuits, for outputting a first abnormal signal when at least one of said high level signal abnormality detection circuits detects an abnormal high level signal, and
   a second concentrating circuit, connected to all said low level signal abnormality detection circuits, for outputting a second abnormal signal when at least one of said low level signal abnormality detection circuits detects an abnormal low level signal;
   wherein each of said high level signal abnormality detection circuits includes a pMOS transistor having a source connected to a positive voltage supply and a gate connected to an output of the corresponding input buffer, and wherein said first concentrating circuit includes a first series circuit having one end commonly connected to drains of all the pMOS transistors of all said high level signal abnormality detection circuits, the other end of said first series circuit being connected to a ground, and said first series circuit including a first active load and an nMOS transistor connected in series between said one end and said other end of said first series circuit, a gate of said nMOS transistor of said first series circuit being connected to the output of one of said input buffers.

2. A semiconductor integrated circuit claimed in claim 1 wherein said first series circuit includes a pMOS transistor connected in series with said active load and said nMOS transistor between said one end and said other end of said first series circuit, a gate of said pMOS transistor of said first series circuit being connected to a test terminal for receiving a test mode signal.

3. A semiconductor integrated circuit claimed in claim 1 wherein each of said low level signal abnormality detection circuits includes an nMOS transistor having a source connected to said ground and a gate connected to an output of the corresponding input buffer, and wherein said second concentrating circuit includes a second series circuit having one end commonly connected to drains of all said nMOS transistors of all said low level signal abnormality detection circuits, the other end of said second series circuit being connected to said positive voltage supply, and said second series circuit including a second active load and a first pMOS transistor connected in series between said one end and said other end of said second series circuit, a gate of said first pMOS transistor of said second series circuit being connected to the output of said one of said input buffers.

4. A semiconductor integrated circuit claimed in claim 3 wherein said second series circuit includes a second pMOS transistor connected in series with said second active load and said first pMOS transistor between said one end and said other end of said second series circuit, a gate of said second pMOS transistor of said second series circuit being connected to a test terminal.

5. A semiconductor integrated circuit claimed in claim 3 further including an OR gate having a first input commonly connected to said drains of said pMOS transistors of all said high level signal abnormality detection circuits and a second input commonly connected to said drains of said nMOS transistors of all said low level signal abnormality detection circuits, so that an output of said OR gate outputs an abnormality detection signal when said at least one of said high level signal abnormality detection circuits detects said abnormal high level signal or when said at least one of said low level signal abnormality detection circuits detects said abnormal low level signal.

6. A semiconductor integrated circuit as recited in claim 1 wherein the plurality of high level signal abnormality detection circuits are configured so that, when a first pattern of input signals, each of which has either a maximum input low level voltage or a minimum input high level voltage for bringing the outputs of all of said input buffers to a logical high level, are respectively input to all of said input buffers, each of said high level signal abnormality detection circuits detects said abnormal high level signal when an output voltage of the corresponding input buffer is lower than a normal high level voltage.

7. A semiconductor integrated circuit as recited in claim 6, wherein said plurality of low level signal abnormality detection circuits are configured so that, when a second pattern of input signals, each of which has either said maximum input low level voltage or said minimum input high level voltage, for bringing the outputs of all of said input buffers into a logical low level, are applied to all of said input buffers, each of said low level signal abnormality detection circuits detects said abnormal low level signal when an output voltage of the corresponding input buffer is higher than a normal low level 8. A semiconductor integrated circuit as recited in claim 7 wherein said nMOS transistor is turned on when the input buffer having its output connected to the gate of said nMOS transistor outputs a high level signal not lower than said normal high level voltage, and wherein when the output voltage of one input buffer is lower than said normal high level voltage, the pMOS transistor having its gate connected to the output of the input buffer outputting the output voltage lower than said normal high level voltage is turned on, so that said first abnormal signal is generated by a current which flows from said positive voltage supply through the turned-on pMOS transistor and said first series circuit to said ground.

9. A semiconductor integrated circuit as recited in claim 3 wherein said first pMOS transistor is turned on when the input buffer having its output connected to the gate of said first pMOS transistor outputs a low level signal not higher than said normal low level voltage, and wherein, when the output voltage of one input buffer is higher than said normal low level voltage, the nMOS transistor having its gate connected to the output of the input buffer outputting the output voltage higher than said normal low level voltage is turned on, so that said second abnormal signal is generated by a current which flows from said positive voltage supply through the turned-on nMOS transistor and said second series circuit to said ground.

10. A semiconductor integrated circuit comprising;
 a plurality of input buffers;
 a plurality of high level signal abnormality detection circuits each including a pMOS transistor having a source connected to a positive voltage supply and a gate connected to an output of a corresponding one of said input buffers, each pMOS transistor having such a threshold that, when a first pattern of input signals, each of which has either one of a maximum input low level voltage and a minimum input high level voltage and which bringing the outputs of all of said input buffers into a logical high level, are applied to all of said input buffers, the pMOS transistor is turned on when an output voltage of the corresponding input buffer is lower than a normal logical high level voltage;
 a plurality of low level signal abnormality detection circuits each including an nMOS transistor having a source connected to a ground and a gate connected to an output of a corresponding one of said input buffers, said nMOS transistor having such a threshold that, when a second pattern of input signals, each of which has either one of said maximum input low level voltage and said minimum input high level voltage and which bringing the outputs of all of said input buffers into a logical low level, are applied to all of said input buffers, the nMOS transistor is turned on when an output voltage of the corresponding input buffer is higher than a normal logical low level voltage;
 a first wired OR circuit including a first series circuit having one end which forms an output of said first wired OR circuit and which is commonly connected to a drain of said pMOS transistor of each of said high level signal abnormality detection circuits, the other end of said first series circuit being connected to said ground, and said first series circuit including a first active load connected between said one end and said other end of said first series circuit, so that, when the output voltage of one input buffer is lower than said normal logical high level voltage, the pMOS transistor having its gate connected to the output of the input buffer outputting the output voltage lower than said normal logical high level voltage is turned on, whereby a current flows from said positive voltage supply through the turned-on pMOS transistor and said first active load to said ground and a first abnormal signal of a high level is generated at said one end of said first series circuit; and a second wired OR circuit including a second series circuit having one end which forms an output of said second wired OR circuit and which is commonly connected to a drain of said nMOS transistor of each of said low level signal abnormality detection circuits, the other end of said second series circuit being connected to said positive voltage supply, and said second series circuit including a second active load connected between said one end and said other end of said second series circuit, so that when the output voltage of one input buffer is higher than said normal logical low level voltage, the nMOS transistor having its gate connected to the output of the input buffer outputting the output voltage higher than said normal logical high level voltage is turned on, so that a current flows from said positive voltage supply through the turned-on nMOS transistor and said second active load to said ground and a second abnormal signal is generated at said one end of said second series circuit.

11. A semiconductor integrated circuit as recited in claim 10 wherein said first series circuit includes an nMOS transistor connected in series with said first active load between said one end and said other end of said first series circuit, a gate of said nMOS transistor of said first series circuit being connected to the output of one of said input buffers so that said nMOS transistor is turned on when the input buffer having its output connected to the gate of said nMOS transistor outputs a high level signal not lower than said normal high level voltage, and wherein said second series circuit includes a first pMOS transistor connected in series with said second active load between said one end and said other end of said second series circuit, a gate of said first pMOS transistor of said second series circuit being connected to the output of said one of said input buffers, so that said first pMOS transistor is turned on when the input buffer having its output connected to the gate of said first pMOS transistor outputs a low level signal not higher than said normal low level voltage.

12. A semiconductor integrated circuit as recited in claim 11 wherein said first series circuit also includes a pMOS transistor connected in series with said active load and said nMOS transistor between said one end and said other end of said first series circuit, a gate of said pMOS transistor of said first series circuit being connected to a test terminal for receiving a test mode signal, and wherein said second series circuit includes a second pMOS transistor between said one end and said other end of said second series circuit, a gate of second pMOS transistor of said second series circuit being connected to said test terminal.

13. A semiconductor integrated circuit as recited in claim 11 further including an OR gate having a first input connected to said one end of said first series circuit and a second input connected to said one end of said second series circuit, so that an output of said OR gate outputs an abnormality detection signal when at least one of said high level signal abnormality detection circuits detects an abnormal high level signal or when at least one of said low level signal abnormality detection circuits detects an abnormal low level signal.

14. An apparatus for detecting defective voltage threshold levels comprising:

a semiconductor integrated circuit including:
an abnormality indicating output,
a plurality of external input pins,
a plurality of input buffers, each having an input, an output, a minimum input high level voltage, and a maximum input low level voltage, the inputs of the plurality of input buffers being respectively connected to the input pins;
abnormality detection means, connected to the outputs of the plurality of input buffers, for outputting an abnormality signal on the abnormality indicating output (a) when a first pattern of input signals, each of which has either the maximum input low level voltage or the minimum input high level voltage for bringing the outputs of all of the input buffers to a logical high level, are respectively input on the external input pins, the abnormality detection means detecting an input buffer that is defective whenever an output of the input buffer that is defective is lower than a normal high level voltage, and (b) when a second pattern of input signals, each of which has either the maximum input low level voltage or the minimum input high level voltage for bringing the outputs of all of the input buffers into a logical low level, are respectively input on the external input pins, the abnormality detection means detecting an input buffer that is defective whenever an output of the input buffer that is defective is higher than a normal low level voltage.

15. An apparatus as recited in claim 14 wherein the abnormality indicating output is an external voltage supply pin, and wherein the abnormality signal is an increase in the current supplied to the external voltage supply pin.

16. An apparatus as recited in claim 14 wherein the abnormality detection means includes a first series circuit comprising:

a pMOS transistor having a source coupled to a positive voltage supply, a drain, and a gate coupled to the output of one of the plurality of input buffers;
a plurality of nMOS transistors having gates respectively coupled to the outputs of the plurality of input buffers, sources respectively coupled to a ground, and drains connected together;
a first load coupled in series between the drain of the pMOS transistor and the drains of the plurality of nMOS transistors.

17. An apparatus as recited in claim 16 wherein the abnormality detection means includes a second series circuit comprising:

a nMOS transistor having a source coupled to the ground, a drain, and a gate coupled to the output of one of the plurality of input buffers;
a plurality of pMOS transistors having gates respectively coupled to the outputs of the plurality of input buffers, sources respectively coupled to the positive voltage supply, and drains connected together;
a second load coupled in series between the drain of the nMOS transistor and the drains of the plurality of pMOS transistors.

* * * * *